United States Patent [19]
Wu et al.

[11] Patent Number: 6,140,685
[45] Date of Patent: *Oct. 31, 2000

[54] STATIC MEMORY CELL AND METHOD OF MANUFACTURING A STATIC MEMORY CELL

[75] Inventors: Jeff Zhiqiang Wu, Meridian; Joseph Karniewicz, Boise, both of Id.

[73] Assignee: Micron Technology, Inc., Boise, Id.

[*] Notice: This patent is subject to a terminal disclaimer.

[21] Appl. No.: 09/307,240

[22] Filed: Apr. 30, 1999

Related U.S. Application Data

[63] Continuation of application No. 09/027,931, Feb. 23, 1998, abandoned, which is a continuation of application No. 08/796,777, Feb. 10, 1997, Pat. No. 5,780,906, which is a continuation of application No. 08/492,774, Jun. 21, 1995, Pat. No. 5,629,546.

[51] Int. Cl.[7] .................................................. H01L 29/76
[52] U.S. Cl. .......................... 257/368; 257/903; 257/904; 257/104
[58] Field of Search ..................... 257/368, 903, 257/904, 104; 365/182

[56] References Cited

U.S. PATENT DOCUMENTS

| | | | |
|---|---|---|---|
| 4,198,644 | 4/1980 | Esaki | 357/12 |
| 4,360,897 | 11/1982 | Lehovec | 365/159 |
| 4,396,999 | 8/1983 | Maslaviya | 365/159 |
| 4,622,573 | 11/1986 | Bakeman, Jr. et al. | 257/376 |
| 4,649,629 | 3/1987 | Miller et al. | 257/50 |
| 5,032,891 | 7/1991 | Takagi et al. | 257/105 |
| 5,084,401 | 1/1992 | Hagino | 437/27 |
| 5,099,191 | 3/1992 | Galler et al. | 323/313 |
| 5,225,700 | 7/1993 | Smayling | 257/321 |
| 5,320,974 | 6/1994 | Hori et al. | 437/44 |
| 5,321,285 | 6/1994 | Lee et al. | 257/296 |
| 5,534,714 | 7/1996 | Beam, III et al. | 257/192 |
| 5,629,546 | 5/1997 | Wu et al. | 257/368 |
| 5,675,533 | 10/1997 | Niuya et al. | 365/182 |
| 5,780,906 | 7/1998 | Wu et al. | 257/104 |

FOREIGN PATENT DOCUMENTS

| | | | |
|---|---|---|---|
| 62-08559 | 1/1987 | Japan | 257/903 |
| 63-174354 | 7/1988 | Japan | 257/903 |
| 0629493 | 2/1994 | Japan | 257/903 |

OTHER PUBLICATIONS

Gladu, *IBM Technical Disclosure Bulletin*, vol. II, No. 10, p. 1218, Mar., 1969.

*Primary Examiner*—Mark V. Prenty
*Attorney, Agent, or Firm*—Wells, St. John, Roberts, Gregory & Matkin, P.S.

[57] ABSTRACT

A static memory cell having no more than three transistors. A static memory cell is formed by providing a semiconductor substrate; forming a buried n-type layer in the substrate, the n-type layer having a first average n-type dopant concentration of at least $1 \times 10^{16}$ ions/cm$^3$; forming an n-channel transistor relative to the substrate over the buried n-type layer, the n-channel transistor having a source, a gate, and a drain, the source having a second average n-type dopant concentration of at least $1 \times 10^{19}$ ions/cm$^3$ and the drain having a third average n-type dopant concentration of at least $1 \times 10^{19}$ ions/cm$^3$, and the source having a depth deeper than the drain so as to be closer to the buried n-type layer than the drain; and forming a p-type region in junction with the source to define a tunnel diode between the p-type region and the source.

12 Claims, 6 Drawing Sheets

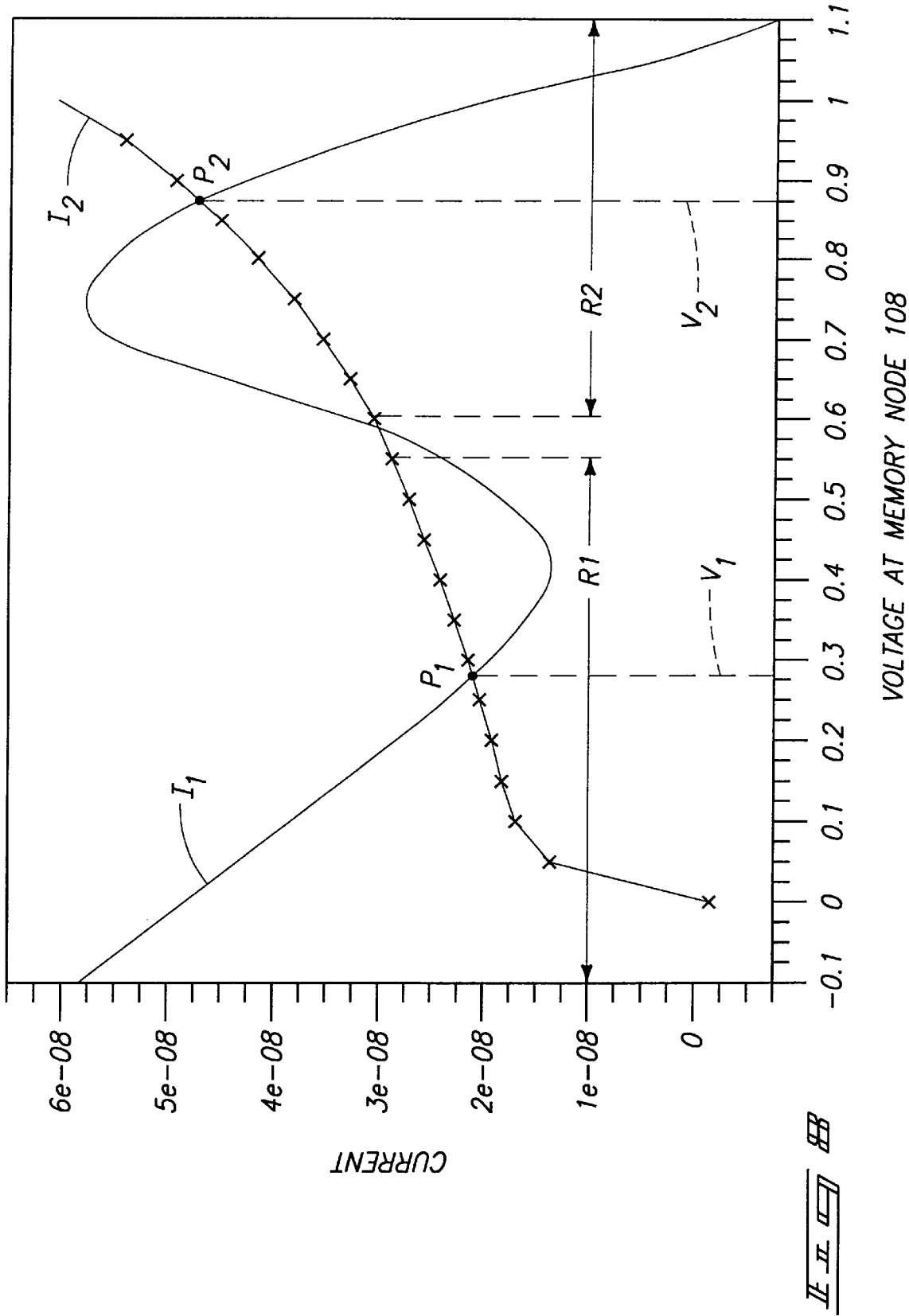

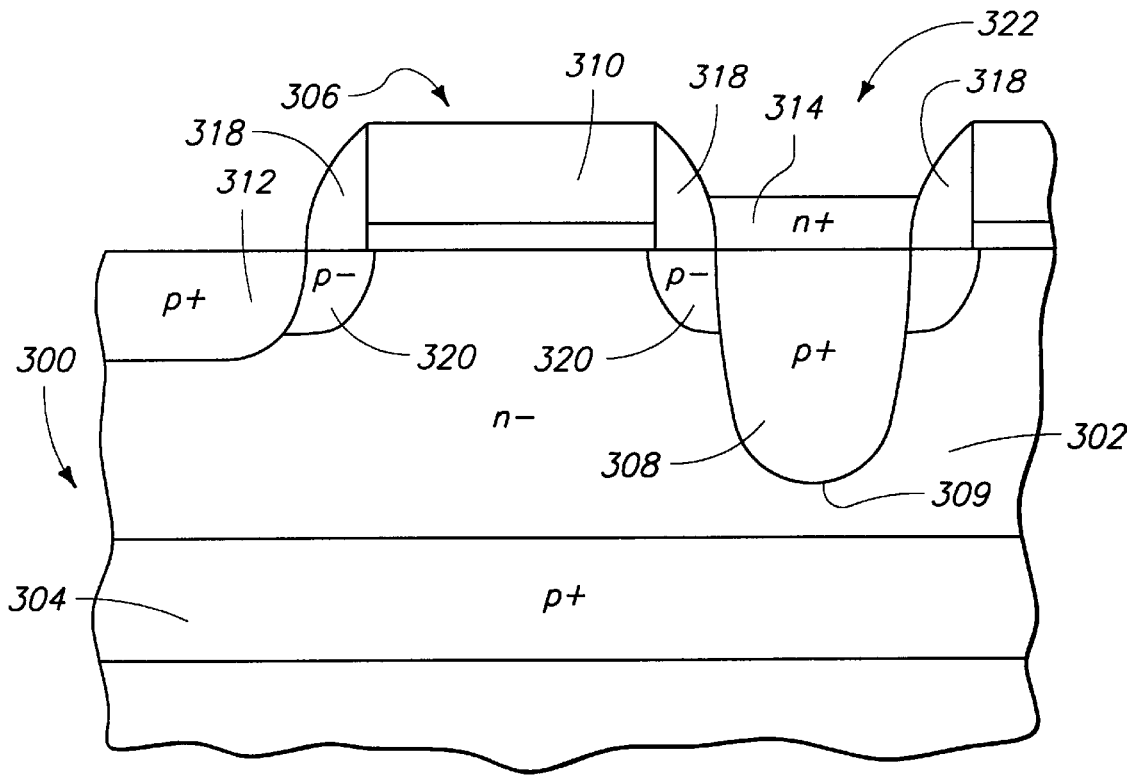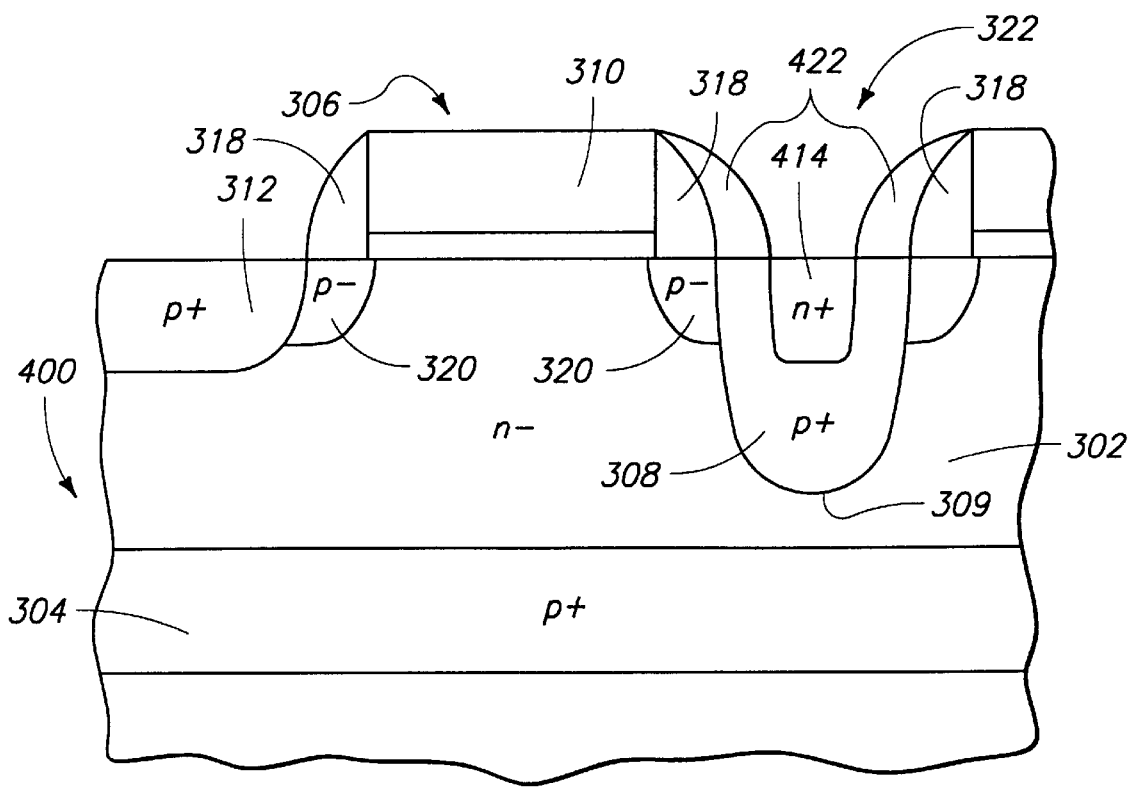

STATIC MEMORY CELL AND METHOD OF MANUFACTURING A STATIC MEMORY CELL

CROSS REFERENCE TO RELATED APPLICATION

This is a continuation of application Ser. No. 09/027,931, filed Feb. 23, 1998, entitled and now abandoned "Novel Static Memory Cell and Method of Manufacturing a Static Memory Cell" listing inventors as Zhiqiang Wu and Joseph Karniewicz, which in turn is a Continuation of Ser. No. 08/796,777, filed Feb. 10, 1997, now U.S. Pat. No. 5,780,906, which in turn is a continuation of U.S. patent application Ser. No. 08/492,774, filed Jun. 21, 1995, now U.S. Pat. No. 5,629,546.

TECHNICAL FIELD

The invention relates to static memory cells.

BACKGROUND OF THE INVENTION

FIG. 1 shows a prior art static read/write memory cell 10 such as is typically used in high-density static random access memories (SRAMs). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

Static memory cell 10 generally comprises first and second inverters 12 and 14 which are cross-coupled to form a bistable flip-flop. Inverters 12 and 14 are formed by n-channel driver transistors 16 and 17, and p-channel load transistors 18 and 19. Driver transistors 16 and 17 are typically metal oxide silicon field effect transistors (MOSFETs) formed in an underlying silicon semiconductor substrate. P-channel transistors 18 and 19 are typically thin film transistors formed above the driver transistors.

The source regions of driver transistors 16 and 17 are tied to a low reference or circuit supply voltage, labelled $V_{ss}$ and typically referred to as "ground." Load transistors 18 and 19 are connected in series between a high reference or circuit supply voltage, labelled $V_{cc}$, and the drains of the corresponding driver transistors 16 and 17. The gates of load transistors 18 and 19 are connected to the gates of the corresponding driver transistors 16 and 17.

Inverter 12 has an inverter output 20 formed by the drain of driver transistor 16. Similarly, inverter 14 has an inverter output 22 formed by the drain of driver transistor 17. Inverter 12 has an inverter input 24 formed by the gate of driver transistor 16. Inverter 14 has an inverter input 26 formed by the gate of driver transistor 17.

The inputs and outputs of inverters 12 and 14 are cross-coupled to form a flip-flop having a pair of complementary two-state outputs. Specifically, inverter output 20 is cross-coupled to inverter input 26, and inverter output 22 is cross-coupled to inverter input 24. In this configuration, inverter outputs 20 and 22 form the complementary two-state outputs of the flip-flop.

A memory flip-flop such as that described typically forms one memory element of an integrated array of static memory elements. A plurality of access transistors, such as access transistors 30 and 32, are used to selectively address and access individual memory elements within the array. Access transistor 30 has one active terminal connected to cross-coupled inverter output 20. Access transistor 32 has one active terminal connected to cross-coupled inverter output 22. A plurality of complementary column line pairs, such as the single pair of complementary column lines 34 and 36 shown, are connected to the remaining active terminals of access transistors 30 and 32, respectively. A row line 38 is connected to the gates of access transistors 30 and 32.

Reading static memory cell 10 requires activating row line 38 to connect inverter outputs 20 and 22 to column lines 34 and 36. Writing to static memory cell 10 requires first placing selected complementary logic voltages on column lines 34 and 36, and then activating row line 38 to connect those logic voltages to inverter outputs 20 and 22. This forces the outputs to the selected logic voltages, which will be maintained as long as power is supplied to the memory cell, or until the memory cell is reprogrammed.

FIG. 2 shows an alternative prior art static read/write memory cell 50 such as is typically used in high-density static random access memories. Static memory cell 50 comprises a-channel pulldown (driver) transistors 80 and 82 having drains respectively connected to load elements or resistors 84 and 86. Transistors 80 and 82 are typically metal oxide silicon field effect transistors (MOSFETs) formed in an underlying silicon semiconductor substrate.

The source regions of transistors 80 and 82 are tied to a low reference or circuit supply voltage, labelled $V_{ss}$ and typically referred to as "ground." Resistors 84 and 86 are respectively connected in series between a high reference or circuit supply voltage, labelled $V_{cc}$, and the drains of the corresponding transistors 80 and 82. The drain of transistor 82 is connected to the gate of transistor 80 by line 76, and the drain of transistor 80 is connected to the gate of transistor 82 by line 74 to form a flip-flop having a pair of complementary two-state outputs.

A memory flip-flop, such as that described above in connection with FIG. 2, typically forms one memory element of an integrated array of static memory elements. A plurality of access transistors, such as access transistors 90 and 92, are used to selectively address and access individual memory elements within the array. Access transistor 90 has one active terminal connected to the drain of transistor 80. Access transistor 92 has one active terminal connected to the drain of transistor 82. A plurality of complementary column line pairs, such as the single pair of complementary column lines 52 and 54 shown, are connected to the remaining active terminals of access transistors 90 and 92, respectively. A row line 56 is connected to the gates of access transistors 90 and 92.

Reading static memory cell 50 requires activating row line 56 to connect outputs 68 and 72 to column lines 52 and 54. Writing to static memory cell 10 requires first placing selected complementary logic voltages on column lines 52 and 54, and then activating row line 56 to connect those logic voltages to outputs 68 and 72. This forces the outputs to the selected logic voltages, which will be maintained as long as power is supplied to the memory cell, or until the memory cell is reprogrammed.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper and lower circuit supply voltages. Intermediate output voltages, between the upper and lower circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell. Because of the significantly different architectural arrangements and functional requirements of static and dynamic memory cells and circuits, static memory design has developed along generally different paths than has the design of dynamic memories.

Tunnel diodes are known in the art. A tunnel diode is a diode having a p-n junction, with both sides of the junction highly doped (p+/n+). In other words, both sides of the diode are doped into degeneracy. Because of the high doping levels, tunnelling of electrons is permitted in the forward direction across the junction (i.e., when a positive voltage is applied to the p+ region). FIG. 3 is an energy band diagram of a tunnel diode. As applied positive bias increases, the height of the potential barrier at the junction decreases, and the width increases. As positive bias increases, the tunnel diode exhibits a characteristic with a negative differential resistance portion, as tunnel effect contributes progressively less towards conductance of the diode (FIG. 4). As positive bias further increases, current reaches a valley point 96 where tunnel effect ceases. For voltages above the valley point 96, the tunnel diode behaves like an ordinary p-n junction diode. The dashed line in FIG. 4 represents the characteristic of an ordinary p-n junction diode. Tunnelling also occurs in the reverse direction in a manner similar to that for a Zener diode, except that breakdown voltage occurs at a small positive value of voltage, at peak point 98.

BRIEF DESCRIPTION OF THE DRAWINGS

Preferred embodiments of the invention are described below with reference to the following accompanying drawings.

FIG. 8 is a current-voltage characteristic diagram of the static memory cell of FIG. 5.

FIG. 9 is a diagrammatic sectional view of a wafer fragment comprising another alternative static memory cell embodying the invention.

FIG. 10 is a diagrammatic sectional view of a wafer fragment comprising another alternative static memory cell embodying the invention.

DETAILED DESCRIPTION OF THE PREFERRED EMBODIMENTS

Figure 1:
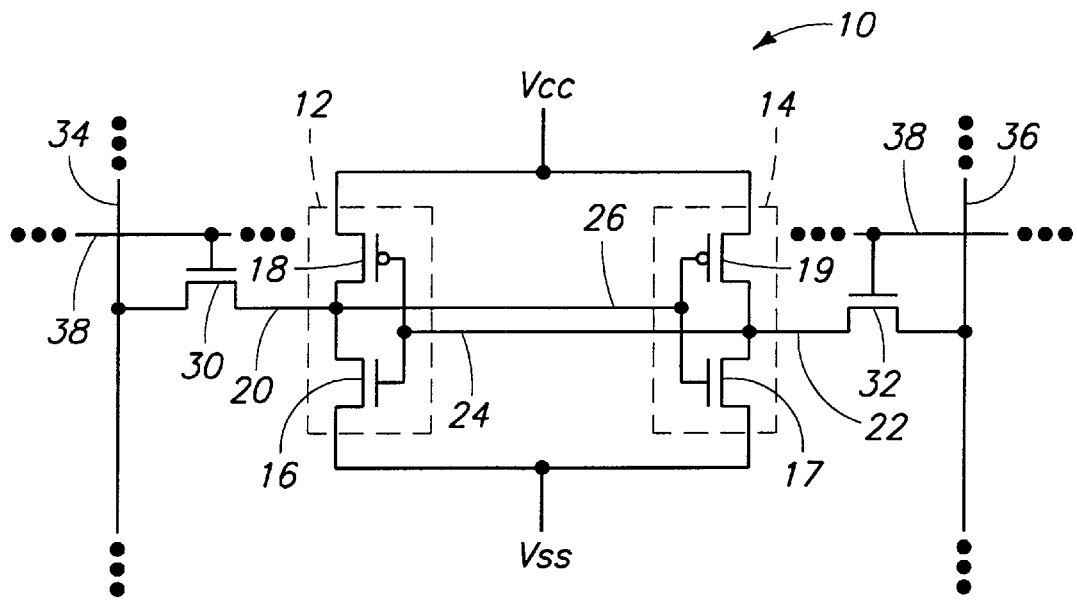
FIG. 1 is a circuit schematic of a prior art static memory cell.
Figure 2:
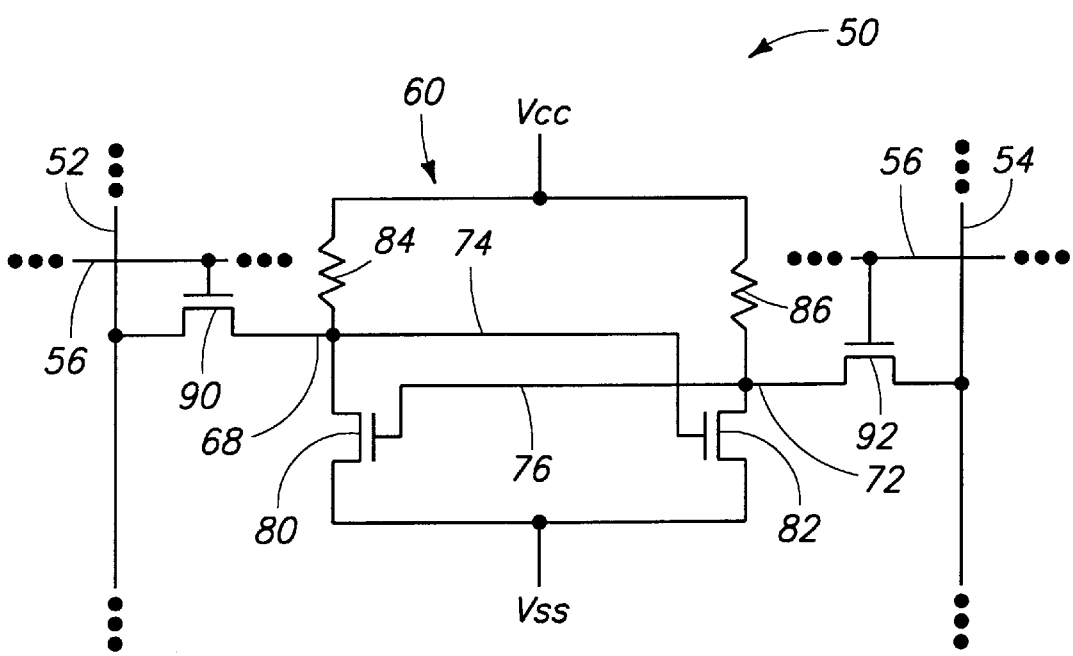
FIG. 2 is a circuit schematic of another prior art static memory cell.
Figure 3:
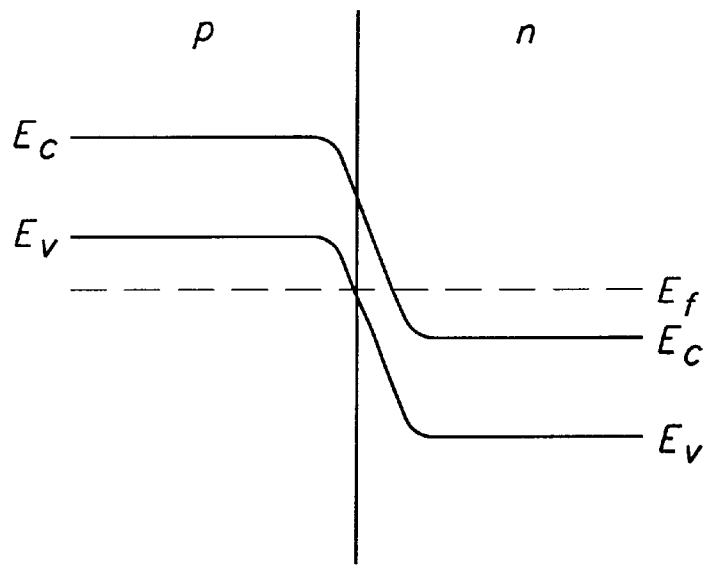
FIG. 3 is an energy band diagram of a prior art tunnel diode.
Figure 4:
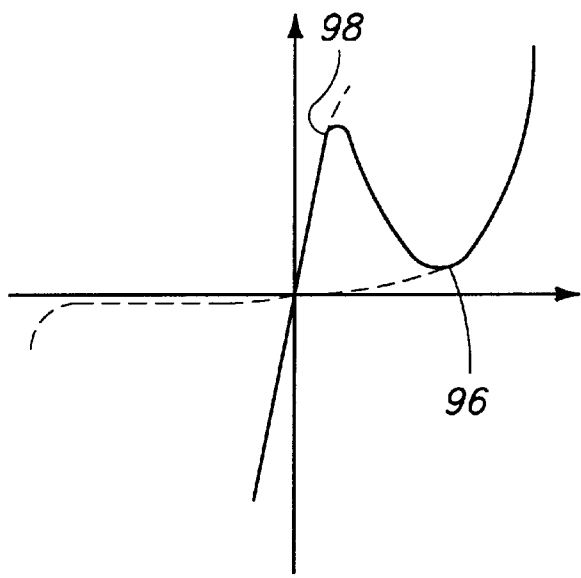
FIG. 4 is a current-voltage characteristic diagram of the prior art tunnel diode of FIG. 3.

This disclosure of the invention is submitted in furtherance of the constitutional purposes of the U.S. Patent Laws "to promote the progress of science and useful arts" (Article 1, Section 8).

The invention provides a static memory cell having no more than three transistors. One aspect of the invention provides a static memory cell having no more than one MOSFET.

Another aspect of the invention provides a semiconductor processing method of manufacturing a static memory cell, the method comprising the following steps: providing a semiconductor substrate; forming a buried n-type layer in the substrate, the n-type layer having a first average n-type dopant concentration of at least $1 \times 10^{19}$ ions/cm$^3$; forming an n-channel transistor relative to the substrate over the buried n-type layer, the n-channel transistor having a source, a gate, and a drain, the source having a second average n-type dopant concentration of at least $1 \times 10^{19}$ ions/cm$^3$ and the drain having a third average n-type dopant concentration of at least $1 \times 10^{19}$ ions/cm$^3$, and the source having a depth deeper than the drain so as to be closer to the buried a-type layer than the drain; and forming a p-type region in junction with the source to define a tunnel diode between the p-type region and the source.

Another aspect of the invention provides a method of manufacturing and operating a static memory cell, the method comprising the following steps: providing a p-type semiconductor substrate having an average p-type dopant concentration of at least $1 \times 10^{16}$ ions/cm$^3$; forming a buried n-type layer in the substrate, the n-type layer having an average n-type dopant concentration of at least $1 \times 10^{19}$ ions/cm$^3$; forming an n-channel transistor relative to the substrate over the buried n-type layer, the n-channel transistor having a gate, a memory node having an average n-type dopant concentration of at least $1 \times 10^{19}$ ions/cm$^3$, and a digit line node having an average n-type dopant concentration of at least $1 \times 10^{19}$ ions/cm$^3$, and the memory node being closer to the buried n-type layer than the digit line node; forming a p-type region in junction with the source to define a tunnel diode between the p-type region and the source; applying a first voltage to the p-type region; applying a second voltage to the buried n-type layer, the second voltage being lower than the first voltage; and applying a third voltage to the substrate, the third voltage being between the first voltage and the second voltage.

Another aspect of the invention provides a static memory cell comprising a semiconductor substrate of a first conductivity type; a buried layer in the substrate, the buried layer having a second conductivity type opposite to the first conductivity type, and the buried layer having an average dopant concentration of at least $1\times10^{19}$ ions/cm$^3$; a transistor formed relative to the substrate over the buried layer, the transistor having a channel of the second conductivity type, the transistor having a gate, a memory node having an average dopant concentration of at least $1\times10^{19}$ ions/cm$^3$, and a digit line node having an average dopant concentration of at least $1\times10^{19}$ ions/cm$^3$; and a region in junction relation with the memory node and defining a tunnel diode between the region and the memory node, the region having an average dopant concentration of at least $1\times10^{19}$ ions/cm$^3$.

Another aspect of the invention provides a static memory cell comprising a semiconductor substrate of a first conductivity type; a buried layer in the substrate, the buried layer having a second conductivity type opposite to the first conductivity type; a transistor formed relative to the substrate over the buried layer, the transistor having a source of the second conductivity type, a gate, and a drain of the second conductivity type, the source having a depth in the substrate greater than the depth of the drain; and a region in junction relation with the source, the region being of the first conductivity type.

Another aspect of the invention provides a static memory cell comprising a semiconductor substrate; a transistor formed in the substrate, the transistor including a gate, a first n+ region having a depth in the substrate, and a second n+ region having a depth in the substrate greater than the depth of the first n+ region; an n+ buried layer below the second n+ region; and a p+ region above the second n+ region and over the substrate.

Another aspect of the invention provides a static memory cell comprising a semiconductor substrate; a transistor formed in the substrate, the transistor including a gate, a first p+ region having a depth in the substrate, and a second p+ region having a depth in the substrate greater than the depth of the first p+ region; a p+ buried layer below the second p+ region; and an n+ region above the source region and over the substrate.

Another aspect of the invention provides a static memory cell comprising a p-type semiconductor substrate having an average p-type dopant concentration of at least $1\times10^{16}$ ions/cm$^3$ and being connected to a first voltage; a buried n-type diffusion layer in the substrate, the n-type layer having an average n-type dopant concentration of at least $1\times10^{19}$ ions/cm$^3$ and being connected to a second voltage lower than the first voltage; an n-channel transistor formed relative to the substrate over the buried n-type layer, the n-channel transistor having a source, a gate, and a drain, the source having an average n-type dopant concentration of at least $1\times10^{19}$ ions/cm$^3$ and the drain having an average n-type dopant concentration of at least $1\times10^{19}$ ions/cm$^3$; and a p-type region in junction relation with the source and operating in combination with the source to define a tunnel diode, the p-type region being connected to a third voltage higher than the first voltage.

Another aspect of the invention provides a static memory cell comprising an n-type semiconductor substrate having an average n-type dopant concentration of at least $1\times10^{16}$ ions/cm$^3$ and being connected to a first voltage; a buried p-type diffusion layer in the substrate, the p-type layer having an average p-type dopant concentration of at least $1\times10^{19}$ ions/cm$^3$ and being connected to a second voltage greater than the first voltage; a p-channel transistor formed relative to the substrate over the buried p-type layer, the p-channel transistor having a source, a gate, and a drain, the source having an average p-type dopant concentration of at least $1\times10^{19}$ ions/cm$^3$ and the drain having an average p-type dopant concentration of at least $1\times10^{19}$ ions/cm$^3$; and an n-type region in junction relation with the source and operating in combination with the source to define a tunnel diode, the n-type region being connected to a third voltage lower than the first voltage.

Another aspect of the invention provides a static memory cell comprising an n-channel MOSFET having a drain, gate, and source; a npn transistor having a base, a collector, and an emitter; and a tunnel diode having an anode connected to a first voltage, and a cathode connected to the collector of the npn transistor and to the source of the MOSFET.

Another aspect of the invention provides a static memory cell consisting essentially of an n-channel MOSFET having a gate, a drain, and a source; a buried layer of n-type material under the source; and a region of p-type material in junction relation with the source.

Another aspect of the invention provides a static memory cell consisting essentially of a MOSFET having a gate, a drain, and a source; a buried layer under the source; and a region in junction relation with the source and operating with the source as a tunnel diode.

Another aspect of the invention provides a static memory cell consisting essentially of a p-channel MOSFET having a gate, a drain, and a source; a buried layer of p-type material under the source; and a region of n-type material in junction relation with the source.

Figure 5:
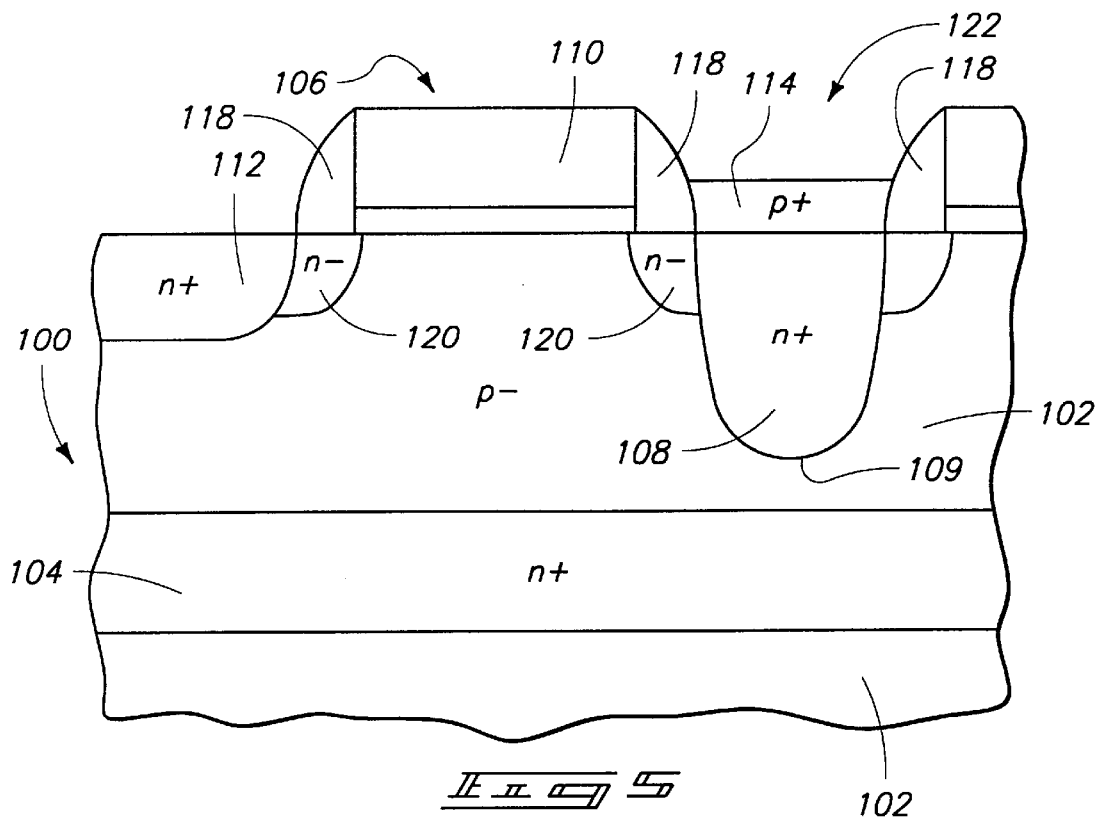
FIG. 5 is a diagrammatic sectional view of a wafer fragment comprising a static memory cell embodying the invention.

FIG. 5 shows a static random access memory cell 100 according to one embodiment of the invention. The memory cell 100 includes a bulk semiconductor silicon substrate 102. The substrate 102 is a p or p- substrate having an average p-type dopant concentration of between $1\times10^{15}$ ions/cm$^3$ and $1\times10^{18}$ ions/cm$^3$. In the most preferred embodiment, the substrate 102 has an average p-type dopant concentration of between $1\times10^{16}$ ions/cm$^3$ and $1\times10^{17}$ ions/cm$^3$.

The memory cell 100 further includes a buried n+ layer 104 in the substrate 102. The n-type layer 104 has an average n-type dopant concentration between $1\times10^{19}$ ions/cm$^3$ and $5\times10^{21}$ ions/cm$^3$. In the most preferred embodiment, the layer 104 has an average n-type dopant concentration between $1\times10^{20}$ ions/cm$^3$ and $5\times10^{20}$ ions/cm$^3$. In one embodiment, the buried n-type layer 104 is formed by a dose of $4\times10^{15}$ ions/cm$^2$ of arsenic at approximately 500 KeV.

The memory cell 100 further includes an n-channel transistor 106 formed relative to the substrate 102 over the buried n-type layer 104. The n-channel transistor 106 has an n+ memory node 108, a gate 110, and an n+ digit line node 112. In one illustrated embodiment, the memory node 108 is defined by the source of the transistor 106, and the digit line node 112 is formed by the drain of the transistor 106. In an alternative embodiment, the memory node 108 is defined by the drain of the transistor 106, and the digit line node 112 is formed by the source of the transistor 106.

The memory node 108 has an average n-type dopant concentration of between $1\times10^{19}$ ions/cm$^3$ and $5\times10^{21}$ ions/cm$^3$. In the most preferred embodiment, the memory node 108 has an average n-type dopant concentration between $5\times10^{19}$ and $1\times10^2$ ions/cm$^3$. The memory node 108 extends deeper into the substrate than the digit line node 112 so as to be an acceptable close distance from the buried n-type layer 104. More particularly, the source includes a lowest-most portion 109 which is $\leq 0.4$ micron above the buried n-type layer. In the most preferred embodiment, the lowest-most portion 109 of the source is $\leq 0.1$ micron above the buried n-type layer. In one embodiment, the source is formed by implanting $1\times10^{15}$ ions/cm$^2$ arsenic at approximately 45 KeV, and subsequently implanting $1\times10^{15}$ ions/cm$^2$ phosphorus at approximately 200 KeV.

The digit line node 112 has an average n-type dopant concentration of between $1\times10^{19}$ ions/cm$^3$ and $5\times10^{21}$ ions/cm$^3$. In the most preferred embodiment, the digit line node 112 has an average n-type dopant concentration between $5\times10^{19}$ and $1\times10^{20}$ ions/cm$^3$. In one embodiment, the drain is formed by implanting $1\times10^{15}$ ions/cm$^2$ arsenic at 45 KeV.

The memory cell 100 further includes a p+ region 114 in junction relation with the memory node 108 and defining a tunnel diode between the region 114 and the memory node 108. The region 114 comprises a p-type material having an average p-type dopant concentration between $1\times10^{19}$ ions/cm$^3$ and $5\times10^{21}$ ions/cm$^3$. In the embodiment shown in FIG. 5, the p-type region comprises epitaxial silicon grown over the source and is accordingly above the substrate 102.

The memory cell 100 further includes spacers 118, and LDD implants 120.

Figure 6:
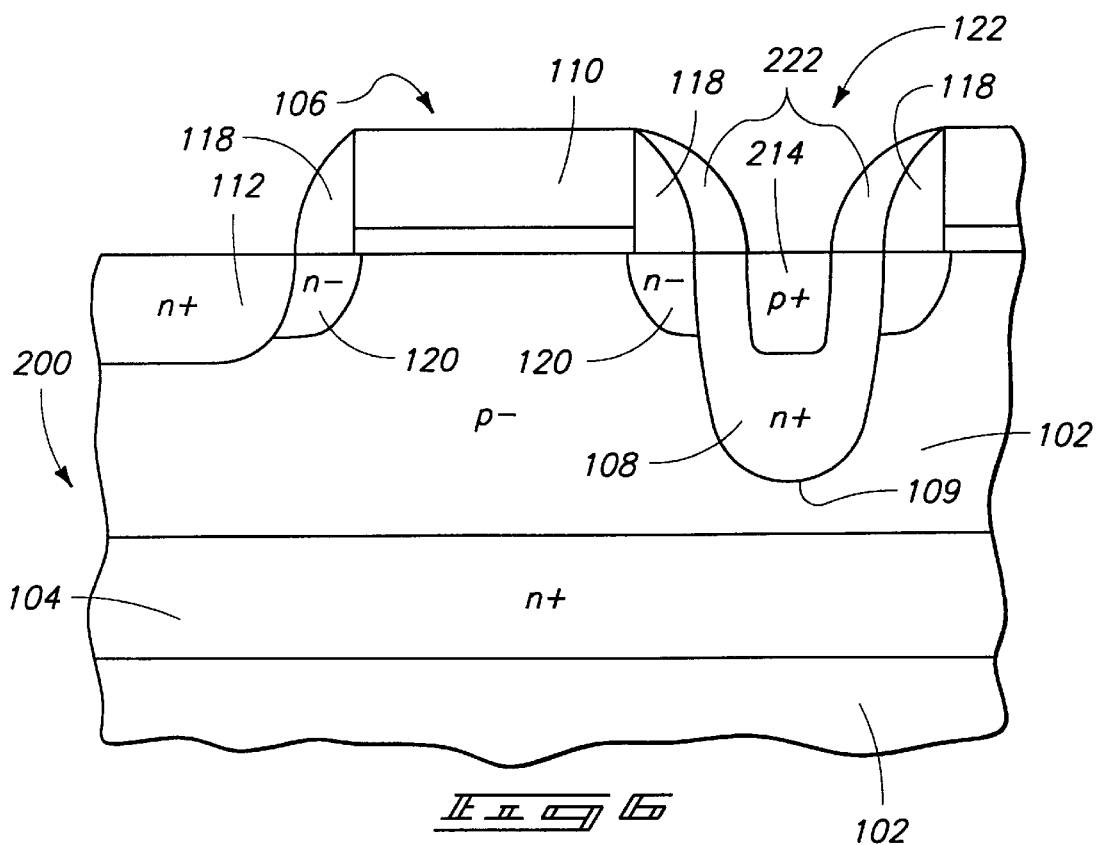
FIG. 6 is a diagrammatic sectional view of a wafer fragment is comprising an alternative static memory cell embodying the invention.

FIG. 6 shows a static random access memory cell 200 which includes features similar to those of the memory cell 100 shown in FIG. 5, like reference numerals indicating like components, except that p-type region 214 comprises an implant in the source. The memory cell 200 includes a bulk semiconductor silicon substrate 102, and a buried n-type layer 104. The memory cell 200 further includes an n-channel transistor 106 formed relative to the substrate 102 over the buried n-type layer 104. The n-channel transistor 106 of memory cell 200 has a memory node 108, a gate 110, and a digit line node 112. The memory cell 200 further includes spacers 118. Region 214 within memory node 108 can be created by using additional spacers 222. The spacers 222 provide a mask to the p-type implant, thus concentrating the region 214 centrally relative to the lateral confines of the n-type memory node 108.

In operation, the p-type region 114 or 214 is held at a first voltage, while the n-type layer 104 is held at a second voltage, lower than the first voltage. The substrate 102 is held at some intermediate voltage to provide a slight forward bias (e.g., less than 0.2 Volt) between the n-type layer 104 and the substrate 102. The distance between the memory node 108 and the n-type layer 104 will determine the required voltage for the substrate 102. In one embodiment, the p-type region 114 is held at between 0.75 Volt and 1.5 Volts, the n-type layer 104 is held at a voltage lower than that of the p-type region 114 or 214, and the substrate is held at 0.2 Volts above the voltage of the n-type layer 104 for a distance of less than 0.4 micron between the memory node 108 and the n-type layer 104. In the most preferred embodiment, the p-type region 114 or 214 is held at 1 Volt, the n-type layer 104 is held at 0 Volts, and the substrate is held at is 0.2 Volts for a distance of less than 0.4 micron between the memory node 108 and the n-type layer 104. The tunnel diode (formed by the p-type region 114 or 214 and the memory node 108) in combination with the buried n-type layer 104 work together to maintain a stable potential condition in the memory node 108. If voltage in the memory node 108 falls below this stable value, the tunnel diode effect will bring the voltage back up. If the voltage rises above this stable value, the npn transistor formed by the memory node 108, the substrate 102, and the buried layer 104 will work to bring it back down.

Figure 7:
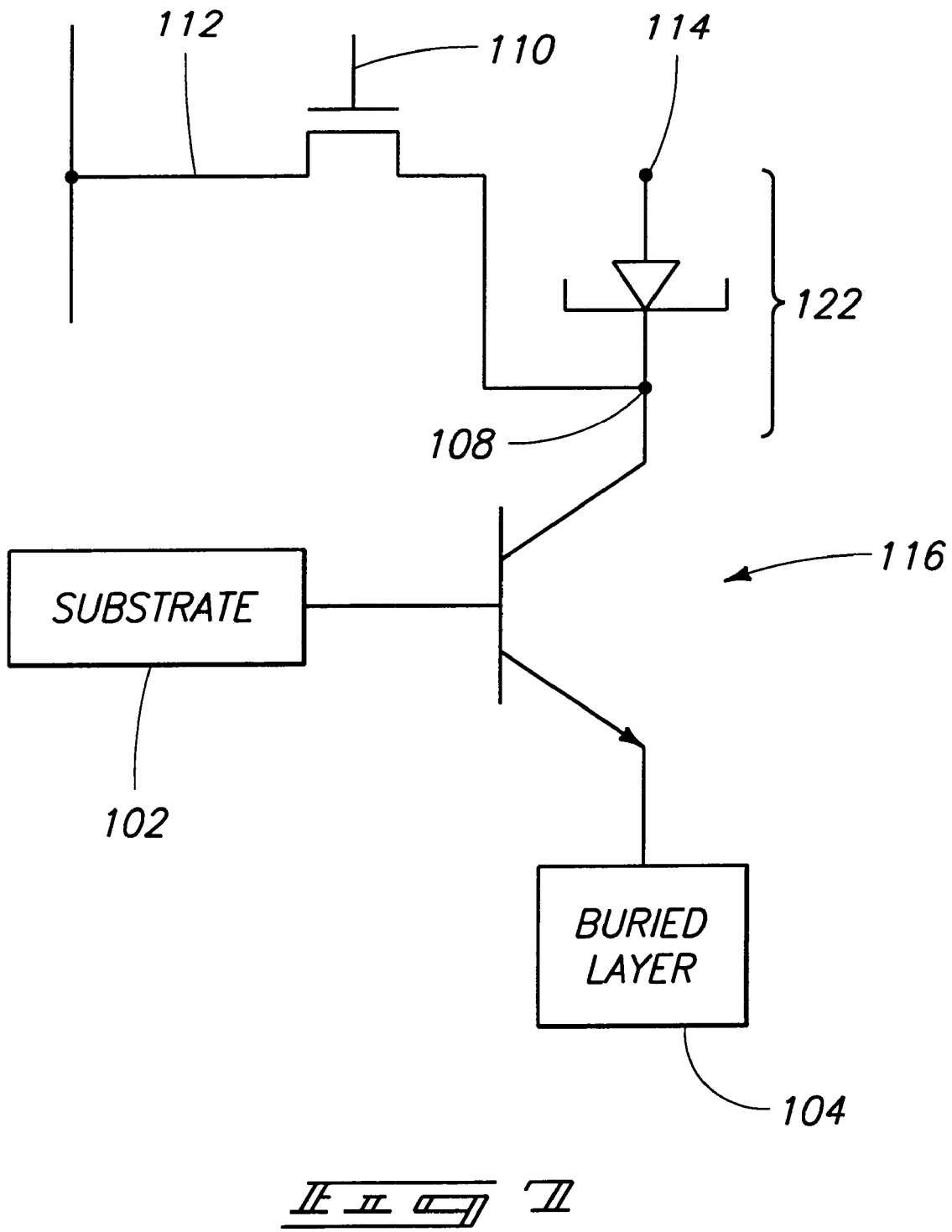
FIG. 7 is a circuit schematic of the static memory cell of FIG. 5.

FIG. 7 is a circuit schematic of the memory cell 100, and shows the digit line node 112, the gate 110, the tunnel diode 122, the memory node 108, the substrate 102, and the buried n-type layer 104. A parasitic npn transistor 116 is formed by the buried n-type layer 104, the substrate 102, and the memory node 108. The buried n-type layer 104 acts as an emitter of a parasitic npn transistor 116. The p-type substrate 102 acts as the base of the parasitic npn transistor 116, and the memory node 108 acts as the collector of the parasitic npn transistor 116. The npn transistor 116 is lightly biased into the active region so that it can serve as a current sink for the memory node 108. The amount of forward bias will be determined by the voltage at the substrate 102.

FIG. 8 is a plot of current vs. voltage for the SRAM 100 shown in FIG. 5. The initially descending curve $I_1$ illustrates current flowing from the p-type region 114 or 214 to the memory node 108. The other curve $I_2$ illustrates current flowing from the memory node 108 through the substrate 102 to the n-type layer 104.

In accordance with the invention, the illustrated two stable states $P_1$ and $P_2$ are provided. With a constant voltage applied to the p-type region 114 or 214, and a differential between substrate 102 and n-type layer 104, any voltage on storage node 108 falling within the $R_1$ range will stabilize at point $P_1$ where $I_1=I_2$. Any deviation from $P_1$ within the $R_1$ range will cause non-zero current $(I_1-I_2)$ to flow into $(I_1>I_2)$ or out of $(I_1<I_2)$ the node 108. Therefore, the voltage on node 108 will increase or decrease to $V_1$ and stabilize at point $P_1$. Likewise, any voltage within the $R_2$ region will stabilize at point $P_2$ due to the equalization of current $I_1$ and $I_2$. Note that there is another state which is an extraneous stable state or a metastable state where the $I_1$ and $I_2$ curves cross. However, any deviation from this undesirable point will cause the currents to equalize at either the $P_1$ or $P_2$ voltage states.

Accordingly, in operation, with zero Volts for the memory node 108, $I_1$ will equal $I_2$ with the source voltage stabilizing at the indicated state $P_1$. Consider the situation where a high voltage of, for example, one Volt is desired to be written and maintained in the memory node 108. Accordingly, a voltage slightly higher than one Volt is provided to the illustrated digit line node 112. The gate 110 is activated to cause one Volt to be provided in the illustrated memory node 108. The gate would subsequently be turned off. The result would be an $I_2$ which falls to the right of the illustrated stable $P_2$ point. The voltage would drop to the point where $I_1$ equals $I_2$ at the stable $P_2$ point, with voltage being maintained at the illustrated value on the x axis. Accordingly, the voltage would be maintained at this point and there would be no requirement for any refresh in contradistinction to a conventional DRAM cell in which there is constant leakage from the diffusion region to the substrate and through the capacitor.

FIGS. 9 and 10 show alternative embodiments, complementary to the embodiments shown in FIGS. 5 and 6, with p-type material substituted for n-type material, n-type material substituted for p-type material, and with negative voltages applied instead of the various positive voltages. Operation is similar to the embodiments shown in FIGS. 5 and 6. The embodiments shown in FIGS. 9 and 10 are manufactured using semiconductor processing steps that are substantially identical to the steps employed for manufacturing the embodiments of FIGS. 5 and 6, respectively, except with n-type material substituted for p-type material, and with p-type material substituted for n-type material.

More particularly, FIG. 9 shows a memory cell 300 including a substrate 302, and a p-channel transistor 306 formed relative to the substrate 302 over a buried p-type layer 304. The p-channel transistor 306 has a memory node 308, a gate 310, and a p+ digit line node 312. In one embodiment, the memory node 308 is defined by the source of the transistor 306, and the digit line node 312 is defined by the drain of the transistor. In an alternative embodiment, the memory node 308 is defined by the drain of the transistor 306, and the digit line node 312 is defined by the source of the transistor.

The memory node 308 has an average p-type dopant concentration of between $1 \times 10^{19}$ ions/cm$^3$ and $5 \times 10^2$ ions/cm$^3$. In the most preferred embodiment, the memory node 308 has an average p-type dopant concentration between $5 \times 10^{19}$ and $1 \times 10^{20}$ ions/cm$^3$. The memory node 308 extends deeper into the substrate than the digit line node 312 so as to be an acceptable close distance from the buried p-type layer 304. More particularly, the memory node includes a lowestmost portion 309 which is $\leq 0.4$ micron above the buried p-type layer. In the most preferred embodiment, the lowestmost portion 309 of the memory node is $\leq 0.1$ micron above the buried p-type layer 304.

The digit line node 312 has an average p-type dopant concentration of at between $1 \times 10^{19}$ ions/cm$^3$ and $5 \times 10^{21}$ ions/cm$^3$. In the most preferred embodiment, the digit line node 312 has an average p-type dopant concentration between $5 \times 10^{19}$ and $1 \times 10^{20}$ ions/cm$^3$.

The memory cell 300 further includes an n-type region 314 in junction relation with the memory node 308 and defining a tunnel diode between the n-type region 314 and the memory node 308. The n-type region in junction with the source comprises n-type material having an average n-type dopant concentration of at least $1 \times 10^{19}$.

The memory cell 300 further includes spacers 318, and LDD implants 320.

FIG. 10 shows a static random access memory cell 400 which includes features similar to those of the memory cell 300 shown in FIG. 9, like reference numerals indicating like components, except that n-type region 414 comprises an implant in the source. The memory cell 400 includes a bulk semiconductor silicon substrate 302, and a buried p-type layer 304. The memory cell 400 further includes an p-channel transistor 306 formed relative to the substrate 302 over the buried p-type layer 304. The p-channel transistor 306 of memory cell 400 has a memory node 308, a gate 310, and a digit line node 312. The memory cell 400 further includes spacers 318. Region 414 within memory node 308 can be created by using additional spacers 422. The spacers 422 provide a mask to the n-type implant, thus concentrating the region 414 centrally relative to the lateral confines of the memory node 308.

In operation, the n-type region 314 or 414 is held at a first voltage, while the p-type layer 304 is held at a second voltage, higher or less negative than the first voltage. The substrate 302 is held at some intermediate voltage. The distance between the memory node 308 and the p-type layer 304 will determine the required voltage for the substrate 302. In one embodiment, the n-type region 314 or 414 is held at between −0.75 Volt and −1.5 Volts, the p-type layer 304 is held at a voltage higher than that of the n-type region 314 or 414, and the substrate is held at 0.2 Volts below the voltage of the p-type layer 304 for a distance of less than 0.4 micron between the memory node 308 and the p-type layer 304. In the most preferred embodiment, the n-type region 314 or 414 is held at −1 Volt, the p-type layer 304 is held at 0 Volts, and the substrate is held at −0.2 Volts for a distance of less than 0.4 micron between the source 108 and the n-type layer 104.

Thus, an SRAM has been disclosed which is more compact than current SRAMS, and which requires fewer MOSFETS. The SRAM has the advantage of not requiring refresh, and further has the advantage of smaller size.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A memory device comprising:
a static random access memory cell including a p-type semiconductor substrate; an n-type region in the substrate; an n-channel transistor formed over the n-type region, the n-channel transistor having a source defining a memory node, a gate, and a drain; the memory node, the n-type region, and the substrate defining a parasitic transistor with the substrate acting as the base of the parasitic transistor, the memory node acting as the collector of the parasitic transistor, and the n-type region acting as the emitter of the parasitic transistor; and a p+ region in junction relation with the source and operating in combination with the source to define a tunnel diode, the p-type semiconductor substrate being configured to be forward biased relative to the n-type region, and the parasitic transistor being configured to act as a current sink for the memory node.

2. A memory device in accordance with claim 1 wherein the memory node includes a lowermost portion which is $\leq 0.1$ micron above the buried region.

3. A memory device in accordance with claim 1 wherein the memory node includes a lowermost portion which is $\leq 0.4$ micron above the buried region.

4. A memory device in accordance with claim 1 wherein the substrate comprises material having an average dopant concentration of at least $1 \times 10^{16}$ ions/cm$^3$.

5. A memory device in accordance with claim 1 wherein the region in junction relation with the source comprises material having an average dopant concentration of at least $1 \times 10^{19}$.

6. A memory device in accordance with claim 1 wherein the region in junction relation with the memory node comprises epitaxial silicon grown over the source.

7. A memory device in accordance with claim 1 wherein the region in junction relation with the memory node comprises an implant in the memory node.

8. A memory device comprising:
a static random access memory cell including an n-type semiconductor substrate; a p-type region in the substrate; a p-channel transistor formed over the p-type region, the p-channel transistor having a source defining a memory node, a gate, and a drain; the memory node, the p-type region, and the substrate defining a parasitic transistor with the substrate acting as the base of the parasitic transistor, the memory node acting as the collector of the parasitic transistor, and the p-type region acting as the emitter of the parasitic transistor; and an n+ region in junction relation with the source and operating in combination with the source to define a tunnel diode, the n-type semiconductor substrate being configured to be connected to a first voltage, the p-type region being configured to be connected to a second voltage above the first voltage, the n+ region being configured to be connected to a third voltage lower than the first voltage, and the parasitic transistor being configured to be forward biased to act as a current sink for the memory node.

9. A static random access memory cell comprising:
- a p-type semiconductor substrate having an average p-type dopant concentration of at least $1 \times 10^{16}$ ions/cm$^3$ and being configured to be connected to a first voltage;
- a buried n-type diffusion region in the substrate, the n-type region having an average n-type dopant concentration of at least $1 \times 10^{19}$ ions/cm$^3$ and being configured to be connected to a second voltage lower than the first voltage;
- an n-channel transistor formed relative to the substrate over the n-type region, the n-channel transistor having a source, a gate, and a drain, the source having an average n-type dopant concentration of at least $1 \times 10^{19}$ ions/cm$^3$ and the drain having an average n-type dopant concentration of at least $1 \times 10^{19}$ ions/cm$^3$; and
- a p-type region in junction relation with the source and defining in combination with the source a tunnel diode, the p-type region being configured to be connected to a third voltage higher than the first voltage, the source, the n-type region, and the substrate defining a transistor with the substrate acting as the base of the transistor, the memory node acting as the collector of the transistor, and the n-type region acting as the emitter of the transistor.

10. A static memory cell comprising:
- an n-type semiconductor substrate having an average n-type dopant concentration of at least $1 \times 10^{16}$ ions/cm$^3$ and being configured to be connected to a first voltage;
- a buried p-type diffusion region in the substrate, the p-type region having an average p-type dopant concentration of at least $1 \times 10^{19}$ ions/cm$^3$ and being configured to be connected to a second voltage above the first voltage;
- a p-channel transistor formed relative to the substrate over the p-type region, the p-channel transistor having a source, a gate, and a drain, the source having an average p-type dopant concentration of at least $1 \times 10^{19}$ ions/cm$^3$ and the drain having an average p-type dopant concentration of at least $1 \times 10^{19}$ ions/cm$^3$; and
- an n-type region in junction relation with the source and defining in combination with the source a tunnel diode, the n-type region being configured to be connected to a third voltage lower than the first voltage, the source, the p-type region, and the substrate defining a transistor with the substrate acting as the base of the transistor, the memory node acting as the collector of the transistor, and the p-type region acting as the emitter of the transistor.

11. A memory device comprising:
- a static random access memory cell including a p-type semiconductor substrate; an n-type region in the substrate; an n-channel transistor formed over the n-type region, the n-channel transistor having a control electrode and two power electrodes, one of the power electrodes defining a memory node, the memory node having a portion which is ≦0.4 micron above the buried layer; the memory node, the n-type region, and the substrate defining a parasitic transistor with the substrate acting as the base of the parasitic transistor, the memory node acting as the collector of the parasitic transistor, and the n-type region acting as the emitter of the parasitic transistor; and a p+ region in junction relation with the memory node and operating in combination with the memory node to define a tunnel diode.

12. A memory device comprising:
- a static random access memory cell including an n-type semiconductor substrate; a p-type region in the substrate; a p-channel transistor formed over the p-type region, the p-channel transistor having a control electrode and two power electrodes, one of the power electrodes defining a memory node, the memory node having a portion which is ≦0.4 micron above the buried layer; the memory node, the p-type region, and the substrate defining a parasitic transistor with the substrate acting as the base of the parasitic transistor, the memory node acting as the collector of the parasitic transistor, and the p-type region acting as the emitter of the parasitic transistor; and an n+ region in junction relation with the source and operating in combination with the memory node to define a tunnel diode.

* * * * *

UNITED STATES PATENT AND TRADEMARK OFFICE
CERTIFICATE OF CORRECTION

PATENT NO.   : 6.140,685

DATED        : October 31, 2000

INVENTOR(S)  : Zhiqiang Wu and Joseph Karniewicz

It is certified that error appears in the above-identified patent and that said Letters Patent is hereby corrected as shown below:

In the Title, delete "Static"
Column 2, line 24, replace "a-channel" with --n-channel--
Column 4, line 5, delete "is"
Column 4, line 41, replace "a-type" with --n-type--
Column 6, line 61, replace "$10^2$" with --$10^{20}$--
Column 7, line 14, after comprises, delete "a"
Column 9, line 7, replace "$10^2$" with --$10^{21}$--

Signed and Sealed this

Twenty-ninth Day of May, 2001

*Attest:*

NICHOLAS P. GODICI

*Attesting Officer*   *Acting Director of the United States Patent and Trademark Office*